(12) United States Patent
Hoescheler et al.

(10) Patent No.: US 11,201,075 B2
(45) Date of Patent: Dec. 14, 2021

(54) HOLDING APPARATUS FOR ELECTROSTATICALLY HOLDING A COMPONENT, INCLUDING A BASE BODY JOINED BY DIFFUSION BONDING, AND PROCESS FOR ITS MANUFACTURE

(71) Applicant: Berliner Glas KGaA Herbert Kubatz GmbH & Co., Berlin (DE)

(72) Inventors: Stefan Hoescheler, Berlin (DE); David Kieven, Berlin (DE); Marcel Ziemann, Berlin (DE); Carsten Pampuch, Berlin (DE)

(73) Assignee: BERLINER GLAS GMBH, Berlin (DE)

( * ) Notice: Subject to any disclaimer, the term of this patent is extended or adjusted under 35 U.S.C. 154(b) by 78 days.

(21) Appl. No.: 16/750,517

(22) Filed: Jan. 23, 2020

(65) Prior Publication Data
US 2020/0234992 A1 Jul. 23, 2020

(30) Foreign Application Priority Data
Jan. 23, 2019 (DE) .......................... 102019101657.6

(51) Int. Cl.
*H01T 23/00* (2006.01)
*H01L 21/683* (2006.01)
(52) U.S. Cl.
CPC ................................ *H01L 21/6833* (2013.01)
(58) Field of Classification Search
None
See application file for complete search history.

(56) References Cited

U.S. PATENT DOCUMENTS

| | | | |
|---|---|---|---|
| 4,487,644 A | 12/1984 | Gupta et al. | |
| 5,754,391 A | 5/1998 | Bates | |
| 5,812,362 A | 9/1998 | Ravi | |
| 5,838,529 A | 11/1998 | Shufflebotham et al. | |

(Continued)

FOREIGN PATENT DOCUMENTS

| | | |
|---|---|---|
| EP | 0076467 | 12/1986 |
| JP | 2008124265 | 5/2008 |

OTHER PUBLICATIONS

Search Report for related British Patent Application No. GB2000854.6 dated Jun. 5, 2020.

(Continued)

*Primary Examiner* — Stephen W Jackson
(74) *Attorney, Agent, or Firm* — Caesar Rivise, PC

(57) ABSTRACT

A holding apparatus, which is adapted for electrostatically holding a component, in particular a wafer, comprises an electrically insulating base body, which comprises a first pair of base body plates, which are connected to one another in a planar manner via a joint connection, and an electrode device with at least one electrode layer, which is arranged to generate an electrostatic holding force and extends parallel to the extension of the base body plates along the joining connection, wherein the joining connection comprises a diffusion bond connection, wherein the at least one electrode layer is connected in a planar manner to the respectively adjacent base body plate, and the at least one electrode layer has a contact section, which is arranged for electrically contacting the at least one electrode layer. Methods for manufacturing the holding apparatus are also described.

20 Claims, 3 Drawing Sheets

(56) References Cited

U.S. PATENT DOCUMENTS

| | | | |
|---|---|---|---|
| 5,998,049 | A | 12/1999 | Tanaka et al. |
| 6,483,690 | B1 | 11/2002 | Nakajima et al. |
| 6,864,957 | B2 | 3/2005 | Van Elp et al. |
| 7,092,231 | B2 | 8/2006 | Hoeks et al. |
| 2008/0151466 | A1 | 6/2008 | Simpson |
| 2008/0237819 | A1 | 10/2008 | Wieland et al. |
| 2011/0288648 | A1 | 11/2011 | Joseph et al. |
| 2015/0022936 | A1 | 1/2015 | Cox et al. |
| 2015/0348816 | A1 | 12/2015 | Stein |
| 2016/0333475 | A1 | 11/2016 | Gomm et al. |
| 2017/0256432 | A1* | 9/2017 | Burmeister ............. H01L 21/82 |
| 2018/0204747 | A1 | 7/2018 | Knyazik |
| 2019/0276366 | A1* | 9/2019 | Sun ....................... C04B 41/009 |

OTHER PUBLICATIONS

English Abstract of JP2008124265.

Akselsen et al., "Review Diffusion Bonding of Ceramics", Journal of Material Science, vol. 27, pp. 569-579, 1992.

Birnie, "A Model for Silicon Self-Diffusion in Silicon Carbide: Anti-Site Defect Motion", Communications of the American Ceramics Society, vol. 69, No. 2, pp. C33-C35, Feb. 1986.

Dong et al., "Joining of SiC Ceramic-Based Materials With Ternary Carbide Ti3SiC2", Material Science and Engineering: B, vol. 176, pp. 60-64, 2011.

Halbig et al., "Diffusion Bonding of Silicon Carbide Ceramics Using Titanium Interlayers", 30th International Conference & Exposition on Advanced Ceramics and Composites, Jan. 22-27, 2006.

\* cited by examiner

HOLDING APPARATUS FOR ELECTROSTATICALLY HOLDING A COMPONENT, INCLUDING A BASE BODY JOINED BY DIFFUSION BONDING, AND PROCESS FOR ITS MANUFACTURE

CROSS-REFERENCE TO RELATED APPLICATIONS

This application claims priority to DE 10 2019 101 657.6, filed Jan. 23, 2019, the contents of which are incorporated herein by reference in their entireties for all purposes.

BACKGROUND OF THE INVENTION

1. Field of Invention

This invention relates to a holding apparatus for electrostatically holding a component, in particular a semiconductor wafer. The invention also relates to methods for manufacturing the holding apparatus. Applications of the invention are available in the provision of equipment or tools for holding components with electrostatic forces, in particular for holding semiconductor wafers, such as e. g. silicon wafers.

2. Description of Related Art

In the present description, reference is made to the following prior art, which represents the technical background of the invention. All references cited herein are incorporated herein by reference in their entireties.
U.S. Pat. No. 7,092,231 B2;
U.S. Pat. No. 6,864,957 B2;
US 2015/0348816 A1;
U.S. Pat. No. 5,998,049 A;
US 2011/0288648 A1;
O. M. Akselsenin "J. of Material Science" 27 (1992), 569-579;
Dunbar P. Birnelin "J. of the American Ceram. S." C-33-C-35 (2) (1986);
US 2011/0288648 A1;
Thomas J. Moore in "Material Science and Engineering" B 176. 60-64 (2011);
Michael C. Halbig et al. Presentation "Diffusion Bonding of Silicon Carbide Ceramics Using Titanium Intermediate layer" NASA, 22 Jan. 2006 (http://nasa.gov/archive/nasa/casi.ntrs.nasa.gov/20060051742.pdf); and
EP 76467 B1.

An electrostatic holding apparatus, which is also referred to as an electrostatic clamping apparatus, electrostatic clamp (ESC) or electrostatic chuck, generally has a plate-shaped base body for receiving the component and an electrode device for generating an electrostatic holding force or, in relation to the area, an electrostatic clamping pressure [1, 2]. The base body can, for example be constructed in one piece from a plate or in multiple layers from multiple base body plates. The electrode device can e.g. include two thin, semicircular electrode layers which are embedded between base body plates and which are separated from one another by an insulating region. When an electrical voltage is applied to the electrode layers, a component lying on the base body is attracted and held in position due to Coulomb's law.

Electrostatic clamps are employed e. g. for positioning semiconductor wafers, in particular silicon wafers, during various processing steps in chip production, such as, for example, lithographic light exposure, 3D wafer bonding, optical inspection and/or other manufacturing steps. For this application, the base body is typically provided with protruding burls on at least one surface, the end faces of which spanning a support surface for the component held (burl support plane).

When processing semiconductor wafers, extreme demands are placed on the accuracy of the positioning of the semiconductor wafers. Line widths of 10 nm or a few 10 nm are generated in the lithographic light exposure of semiconductor wafers. The required positioning accuracy is then a few nm. Another challenging task is 3D wafer bonding, in which two or more wafers are bonded and contacted. Metallic solders, such as those based on Cu, are used for contacting. Very small distances between the soldering contacts are required. In addition to the high positioning accuracy, there is also a requirement for high temperature stability, typically in the range from 250° C. to 500° C., in order to enable the contacts to be soldered between the wafers.

In particular due to the above mentioned requirements, there is an interest in electrostatic clamps with high geometric and thermal stability. The base body plates are therefore typically made of ceramic materials, such as e. g. silicon nitride, aluminum nitride, or aluminum oxide. These combine particularly good electrical properties, in particular high dielectric strength, high specific electrical resistance and high permittivity, with favorable thermal and mechanical properties. Thermal properties are the thermal conductivity, which should be as high as possible, and the thermal expansion, which should be as low as possible, so that the high precision in holding the semiconductor wafer in the lateral direction is ensured even in the event of temperature fluctuations. Mechanical properties are flexural strength, hardness and fracture toughness.

However, the use of ceramic materials can be challenging in the manufacture and operation of clamps. In order to manufacture a multi-layer electrostatic clamp with several base body plates and in particular to connect the base body plates to one another and to the electrode device, the joining methods adhesive bonding (see, for example, [3]), anodic bonding or joint sintering of conductive and non-conductive layers are used.

Adhesive bonding can be disadvantageous if adhesives continue to polymerize after hardening and thus can guarantee permanent geometric stability to a limited extension only. Furthermore, the thermal stability of glued clamps is limited. Glued clamps therefore have limited suitability for many applications in holding of wafers.

A disadvantage of anodic bonding can result from the thermal process conditions of the process and the limited number of suitable materials. Glass layers between the joining partners are typically used for anodic bonding, but they insulate thermally and thus severely impair the necessary thermal flow within the device. In addition, electrically conductive glasses, when used as electrodes, are problematic in comparison to ceramic materials, because glasses are relatively soft and not very resistant to abrasion by the semiconductor wafer, so that the precision of the device deteriorates over time.

When sintering conductive and non-conductive layers together, for example, wire mesh made of tungsten or molybdenum is sintered into the ceramic, or e.g. silicon nitride is doped with molybdenum silicide or titanium nitride to make it electrically conductive [4]. A clamp is then created from different layers of conductive and non-conductive silicon nitride. Since these parts are produced by combining doped and non-doped powders in a hot press and shrinkage occurs during sintering that cannot be determined beforehand, the accuracy of manufacturing the clamp is severely limited. This disadvantage is the same for devices with wire mesh.

The conventional multi-layer structure of a clamp with several base body plates often results in a long, almost fully serial process chain with high costs, limited yield, high expenditure and high costs due to reworking in production and a long delivery time. If the burls are made of a soft di-electric material (e.g. glass), they have a lower wear resistance than ceramic burls. In this case, additionally applied wear protection layers increase the manufacturing effort and they require renewal in regular cycles.

The problems mentioned occur not only in holding apparatuses for holding semiconductor wafers, but also in other applications, such as e. g. in holding apparatuses for holding glass plates.

Another, generally known joining method for producing high-strength connections is diffusion bonding, in which plates, disks or other ceramic components are connected to one another in an uniaxial hot press under pressure and heat (see, for example, [5, 6]). Depending on the diffusivity of the materials, different surface qualities, temperatures and pressures can be used. Diffusion bonding of materials with low intrinsic diffusion [9] can be supported by an intermediate layer (diffusion bond layer) (see e.g. [8, 9, 10, 11]). So far, applications of diffusion bonding have been limited to the connection of joining partners with simple, unstructured surfaces with an extremely high planarity.

BRIEF SUMMARY OF THE INVENTION

A benefit of the invention is to provide an improved holding apparatus for electrostatically holding a component, in particular a semiconductor wafer, with which disadvantages of conventional techniques are avoided. In particular, the holding apparatus is to be able to be manufactured using a simplified method, should have increased geometric and thermal stability, is to be able to hold a component with high precision and/or tolerate applications at elevated temperatures, in particular above 350° C. Furthermore, a benefit of the invention is to provide an improved method for manufacturing an electrostatic holding apparatus with which disadvantages of conventional techniques are avoided. In particular, the method is to be characterized in particular by simplified manufacturing of the holding apparatus, enabling high accuracy, reproducibility and stability of the clamp design and/or by insensitivity to high temperatures.

These benefits are achieved by an electrostatic holding apparatus and a method for manufacturing an electrostatic holding apparatus with the features of the independent claims. Advantageous embodiments and applications of the invention are defined in the dependent claims.

Exemplary embodiments are described herein. It is envisioned, however, that any system that incorporates features of apparatus and systems described herein are encompassed by the scope and spirit of the exemplary embodiments.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1:
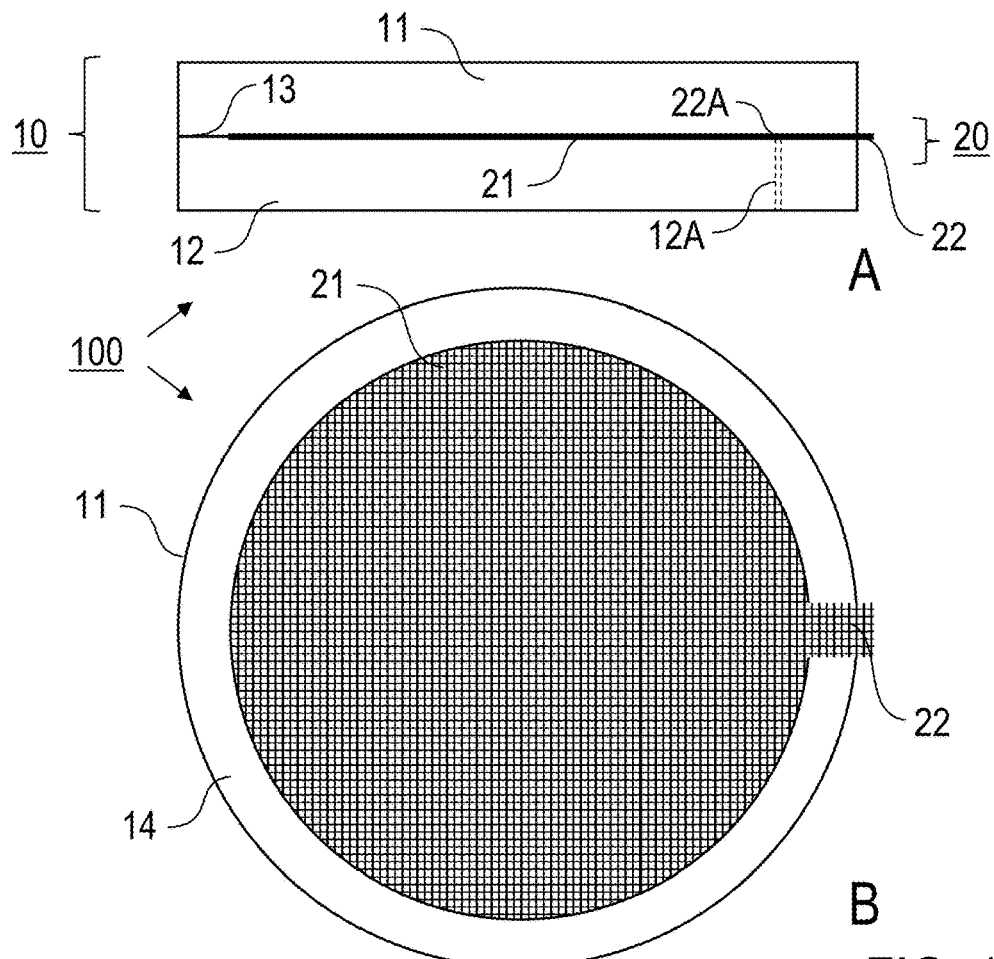
FIG. 1: a schematic illustration of an example of the holding apparatus according to embodiments of the invention.

According to a first general aspect of the invention, the above-mentioned benefit is achieved by an electrostatic holding apparatus for electrostatically holding a component, in particular a semiconductor wafer, such as e. g. a silicon wafer, wherein the electrostatic holding apparatus comprises an electrically insulating, multilayer base body and an electrode device. The base body comprises at least two electrically insulating base body plates (first pair of base body plates), which are connected to one another over a surface by a joint connection. The base body plates are two components which extend in a main plane and preferably have flat surfaces at least on the sides facing one another. The direction along the extension parallel to the main plane is also referred to as the lateral direction and the direction perpendicular thereto as the thickness direction. The base body plates can also be referred to as disks, layers, or sheets. They can each be made in one piece from a single material or from several materials. Furthermore, the base body plates can be made of the same or different materials and have the same or different thicknesses. In particular, one of the base body plates can have a greater thickness than the other base body plate and form a carrier plate (or base plate), while the other base body plate correspondingly can have a smaller thickness and can form a dielectric for setting dielectric properties of the holding apparatus. On the sides facing away from one another, the base body plates can likewise have plane surfaces or alternatively structured surfaces. Structured surfaces include e. g. protruding burls, whose end faces span the burl support plane, or depressions to form tempering lines, e. g. cooling channels.

The electrode device comprises at least one, in particular single-layer or multi-layered, electrode layer, which is configured to generate an electrostatic holding force and is parallel to the preferably planar extension of the base body plates, i. e. preferably extends parallel to the main plane of the base body plates along the lateral extension of the joint connection. The at least one electrode layer is preferably at least one plane continuous (uninterrupted) layer made of an electrically conductive material, in particular with such a high electrical conductivity that when an electrical voltage relative to the earth potential, the potential of a further electrode layer and/or the potential of a component carried by the holding apparatus is applied to the electrode layer, a delay-free generation of the holding force is enabled. The specific electrical resistance of the base body plate and optionally at least one insulating region in lateral direction between the electrode layers (see below) is preferably greater than 103 Ω·cm, particularly preferably larger than 1012 Ω·cm, in particular greater than or equal to 1015 Ω·cm, while the specific electrical resistance of the at least one electrode layer is preferably less than 10 Ω·cm, particularly preferably less than 0.1 Ω·cm, in particular less than or equal to 0.01 Ω·cm. The thickness of the at least one electrode layer is preferably selected in the range from 30 nm to 3000 nm, particularly preferably in the range from 100 nm to 1000 nm. The at least one electrode layer extends in the lateral direction over the entire connection surface of the base body plates or over part of the surface of the joint connection (connection surface). In the latter case, the at least one electrode layer e. g. can have a distance to the edge of the connecting surface. Sections between the base body plates in which there is no electrode layer in the joined base body are also referred to as insulating regions.

According to the invention, the joint connection is a diffusion bond connection, with at least the at least one electrode layer being connected in a planar manner to the adjacent base body plate. If the at least one electrode layer is formed in such a way that insulating regions are present between the base body plates, the base body plates are preferably connected to one another directly or via an insulating intermediate layer in the insulating regions via the diffusion bond connection. Both base body plates are preferably connected to one another without interruption over the entire surface via the diffusion bond connection. The diffusion bond is a joint connection, in which material from one of the joining partners, i. e. from the at least one electrode layer, the base body plate and/or the insulating intermediate layer, is diffused into the respective other joining partner, i. e. into the adjacent base body plate, at least one electrode layer and/or insulating intermediate layer. Diffusion comprises material transport at a temperature below the melting point of the joining partners. A diffusion profile of the materials of the adjacent joining partners is provided perpendicular to the lateral extension of the joining connection formed by diffusion bonding. The joining partners are firmly connected to one another by the materials which have diffused in, in particular by inter-atomic forces between them and the joining partner.

Furthermore, according to the invention, the at least one electrode layer in each case has at least one contact section which is configured for electrically contacting the at least one electrode layer. The contact section comprises at least one layer of an electrically conductive material, preferably of the material of the electrode layer, and it extends parallel to the extension of the base body plates along the lateral extension of the joint connection.

Advantageously, different variants are available for providing the contact section, which can be implemented individually or in combination. In all cases, contacting with a connecting line can be obtained e. g. by soldering and/or by the use of conductive silver or an electrically conductive adhesive.

According to a first variant, the contact section for the electrical contacting of the at least one electrode layer can be arranged at an outer edge of the base body plates. In this case, the contact section preferably has the shape of a conductor strip (conductor path), which is connected on the one hand to the planar electrode layer and on the other hand forms an interface at the edge of the base body plates for connecting a connecting line (cable, wire). The contact section extends through an insulating region from the electrode layer to the edge of the base body plate. Alternatively, the at least one planar electrode layer can extend to the edge of the base body plates. In this case, an edge section of the electrode layer can form the contact section. The contact section at the edge of the base body is preferably exposed in the lateral direction, so that a connecting line for connection to a voltage source can be connected laterally.

According to a second variant, at least one of the base body plates can be formed with a recess at the edge or with a hole. A section of the electrode layer in the region of the hole or the recess, in particular with a distance from the edge of the base body plates, can form the contact section in this case. The contact is made through the hole or the recess perpendicular to the lateral direction of the base body.

According to a third variant, one of the base body plates, which carries the electrode layer, can protrude at least in a section over the other base body plate. In the protruding area, part of the electrode layer is exposed as a contact section for contacting.

According to a second general aspect of the invention, the above benefit is achieved by a method for manufacturing a holding apparatus which is adapted for electrostatically holding a component, in particular a semiconductor wafer. Preferably, the method is used for manufacturing the holding apparatus in accordance with the above first general aspect of the invention. The method according to the invention comprises the steps of providing two base body plates, manufacturing at least one layer of at least one electrically conductive material for forming at least one electrode layer, which has at least one contact section, on at least one of the base body plates, and joining the base body plates with the at least one electrode layer positioned therebetween by diffusion bonding. According to the invention, the joint connection is produced by pressing the base body plates with a mutual arrangement in which the at least one electrode layer with the contact section is located between the base body plates and the contact section is arranged at the edge of the base body plates. The joining connection is a diffusion bond connection, with at least the at least one electrode layer with the contact section is connected in a planar manner with the respectively adjacent base body plate. After the base body plates have been joined, the at least one electrode layer preferably is contacted by connecting the contact section belonging to the at least one electrode layer to a connecting line for connection to a voltage source.

The base body plates are pressed at a temperature and with pressure on the joining partners, which are selected such that the base body plates do not melt or soften and no deformation occurs, and material diffusion takes place from one joining partner into the other joining partner. Typically, the pressing takes place at a temperature above room temperature, so that it is also referred to as hot pressing. The temperature and pressure are selected depending on the material properties of the joining partners. The temperature during hot pressing is preferably in a range from 270° C. to 2000° C., particularly preferably in a range from 1100° C. to 1500° C., while the pressing pressure is preferably 50 bar to 2000 bar, particularly preferably 150 bar to 500 bar.

Advantageously, a multilayer electrostatic clamp with at least one bonded electrode is created with the invention. This device is preferably used in the electrostatic positioning of semiconductor wafers in the manufacture of semiconductor components, in particular microchips, e.g. in a lithographic process or a wafer bond process. The provision of the diffusion bond connection has the particular advantage that the holding apparatus has a geometrically, mechanically and thermally extremely stable structure, in which the at least one electrode layer is firmly integrated. An intimate bond is formed from the joining partners base body plate and electrode layer, in which the at least one electrode layer advantageously fulfills a double function both as an electrode and as a diffusion bonding layer (diffusion-supporting layer, interdiffusion layer). The use of diffusion bonding layers in the diffusion bonding of ceramics is known per se.

However, the inventors have found that, surprisingly, diffusion bonding layers can be electrically conductive and, moreover, can be used as an electrode in the joined electrostatic clamp.

Another advantage of the invention is that different variants of the electrode device are available depending on the specific application of the invention. Thus, the electrode device can be constructed as a unipolar electrode device with a single electrode layer or as a bipolar electrode device with two electrode layers or as a multi-polar electrode device with more than two electrode layers.

According to a particularly preferred embodiment of the invention, the electrode device comprises the at least two electrode layers which extend parallel to the extension of the base body plates along the lateral extension of the joint connection and are arranged separated from one another by at least one insulating region. Each of the electrode layers has at least one contact section which is arranged for contacting the respective electrode layer. In the at least one insulating region, the base body plates have the diffusion bond connection directly or via an insulating intermediate layer. The distance between the electrode layers in the lateral direction (width of the insulating regions) is preferably selected in a range from 0.5 mm to 5 mm. The diffusion bond connection in the at least one insulating region advantageously forms an electrically insulating material composite, so that leakage currents between the electrode layers can be suppressed even when a high voltage, e. g. 3 kV is applied to them.

In terms of the method, the at least two electrode layers of this embodiment are manufactured on at least one of the base body plates and are arranged in such a way that the at least one insulating region is arranged between the at least two electrode layers in the joined base body. All electrode layers can be manufactured on one of the base body plates or the electrode layers can be manufactured on both base body plates so that they are aligned with one another, so that the electrode layers form the desired electrode arrangement of the electrode device. During hot pressing, the base body plates are joined by means of diffusion bonding in such a way that the base body plates are connected directly or via the insulating intermediate layer, in particular in the at least one insulating region.

In the bipolar or multipolar electrode device, undesired charging of the held component can advantageously be avoided. Furthermore, it has surprisingly been found that a stable diffusion bond connection can also be produced in the case of heterogeneous joining partners in which different materials, such as, for example electrode layer/base body plate and base body plate/base body plate and optionally base body plate/intermediate layer, alternate in a lateral direction along the joining connection.

The insulating intermediate layer in the at least one insulating region can be advantageous in order to improve the planarity of the mutually facing surfaces of the joining partners. In the insulating region, the insulating intermediate layer can compensate for a height difference relative to the adjacent electrode layers. The insulating intermediate layer consists, e. g. from $SiO_2$, an oxidic or an oxinitridic glass, silicon nitride, silicon aluminum oxide nitride (SiAlON), yttrium oxide, aluminum oxide, a rare earth oxide ($La_2O_3$ to $Lu_2O_3$), an oxide of the 2nd main group (MgO, CaO, SrO, BaO) or a mixture of the above. The thickness of the insulating intermediate layer is preferably equal to the thickness of the laterally adjacent layer of conductive material for forming an electrode layer. The insulating intermediate layer can be produced e. g. by a lithographic process, in particular using a mask, by sputtering.

Alternatively, the intermediate layer in the at least one insulating region is not absolutely necessary. As a further particular advantage, the inventors found that a stable diffusion bond connection can also be created if electrode layers protrude by a part of their thickness or even completely with their entire thickness above the surface of the respective base body plates and thus introduce minor steps in the mutually facing surfaces of the joining partners. In this case too, the bond result is thermally, mechanically and electrically stable even in the regions without the electrode layers.

The at least two electrode layers between the base body plates are preferably arranged in a common plane. According to a first variant, the at least two electrode layers are produced from at least one flat precursor layer on the at least one of the base body plates. In a first step, the at least one precursor layer is deposited by a deposition process, and in a further step, the at least one planar precursor layer is structured to form the at least two electrode layers and the insulating regions. The structuring is preferably carried out using a lithographic method, in particular using a mask, e. g. photoresist, photo film or a hard mask, e. g. by vacuum deposition or electrolytic deposition. By using the mask, electrode path structures and conductor path structures can be built up. In the lithographic process, the insulating region are preferably produced after exposure through an etching step. According to a second variant, the at least two electrode layers are applied in a structured manner by means of a physical or chemical deposition process.

According to a further preferred embodiment of the invention, the base body plates each comprise a ceramic material. Ceramic material has proven to be particularly advantageous in the formation of the diffusion bond connection. It enables to provide even, possibly polished surfaces of the joining partners and an effective diffusion of foreign atoms. At the same time, it has excellent electrical and mechanical properties for use in an electrostatic holding apparatus. The base body plates particularly preferably each comprise at least one of silicon nitride, silicon carbide, SiAlON, aluminum oxide, oxynitride glass, aluminum nitride, silicate, aluminosilicate or a mixture of at least two of these ceramic materials. The ceramic material of at least one of the base body plates can also be a glass ceramic, such as e. g. Zerodur (trade name).

The electrode layers preferably each comprise a metal, a metal alloy, a semiconductor material or an electrically conductive ceramic. Particularly preferred examples are chromium, silver, gold, platinum, nickel, cobalt, iron, vanadium, tantalum, aluminum, titanium, tungsten, molybdenum, manganese, an alloy of at least two of these materials, or a sequence of layers of two or more of these metals or their alloys, such as an AgCuTi alloy, e.g. Incusil or Ticusil (trade names), a molybdenum manganese alloy, a tin-gold alloy, an eutectic gold-silicon alloy, e.g. $Au94Si6$, silicon, metal nitride, especially titanium nitride (TiN, $Ti_2N$, $Ti_3N_4$), chromium nitride (CrN), metal carbide, and metal silicide, especially molybdenum silicide ($MoSi_2$), or silicon-carbide doped with nitrogen (N). Titanium is particularly preferred because it advantageously has favorable interdiffusion properties and e. g. forms a solid bond of $Ti_3Si_5$ with a Si-based ceramic.

There are advantageously various possibilities for arranging the at least one electrode layer on at least one of the base body plates. According to a first variant, the at least one electrode layer is arranged in the joined base body plate along the joint connection between the base body plates. Atoms of the at least one electrode layer are arranged diffused into the two adjacent base body plates, and atoms of the base body plate are arranged diffused into the at least one electrode layer. In this embodiment, in relation to the method, the layer for the at least one electrode layer is deposited on one base body plate or in each case in parts on both of the base body plates, followed by hot pressing to form the diffusion bond connection. An advantage of this embodiment is the simplified procedure for the production of the at least one electrode layer.

According to a second, alternative variant, the at least one electrode layer is embedded along the joint connection in the interface formed by one of the base body plates. Atoms of the at least one electrode layer are arranged in a diffused manner in the respectively adjacent base body plate with which the diffusion bond connection is made. In this embodiment, in relation to the method, after the layer has been deposited for the at least one electrode layer on one or in part in each case on both of the base body plates, a thermal diffusion process is carried out in order to implant the deposited atoms into the related base body plate. Subsequently, protruding areas of the deposited layer are preferably removed, so that the at least one electrode layer is embedded in one of the base body plates before joining by diffusion bonding.

The holding apparatus is not limited to a configuration with a two-layer base body. According to an embodiment of the invention which is particularly preferred for use in holding of semiconductor wafers, the base body comprises at least two further base body plates (second pair of base body plates), between which at least one further electrode layer of the electrode device is arranged and which have a joint connection like the first pair of base body plates. Also according to one of the variants described above, the at least one further electrode layer has a contact section which is arranged on the edge of the base body for electrically contacting the at least one further electrode rod layer. The first pair of base body plates and the second pair of base body plates are connected to one another in a planar manner. The joint connection can also comprise a diffusion bond connection or alternatively another type of connection. In the finished holding apparatus, the first and the second pair of base body plates form a firmly joined stack of plates.

This embodiment with at least four base body plates offers advantages when using the holding apparatus by providing the first pair of base body plates for electrostatically holding the component and the second pair of base body plates for electrostatically holding the holding apparatus on a tool carrier of a machine. The electrodes within the two pairs of base body plates can be subjected to voltages independently of one another in order to either position or release the component or to fix or release the holding apparatus on the tool carrier. Advantageously, temperature control conduits, in particular cooling channels, can be provided in at least one of the interconnected base body plates of the first pair and the second pair of base body plates.

Preferred embodiments of the invention are described in the following by way of example with reference to features of an electrostatic holding apparatus for silicon wafers, which is schematically shown (not to scale). The implementation of the invention is not limited to this application and the exemplary features of the holding apparatus. Other applications of the holding apparatus are possible, e.g. when holding glass plates with metal coatings, or exposure masks. The design of the base body, in particular the electrodes, the materials and the dimensions of the holding apparatus and its parts, can in particular be adapted to the specific requirements of the respective application. In most examples, the contact sections are shown at the edge of the base body. Alternatively, they can also be arranged at a distance from the edge, as described above. Departing from the illustration, the base body can have further base body plates which fulfill further functions. For practical applications of the holding apparatus e. g. in the handling of semiconductor wafers, the base body typically is provided on one or both sides with burls, as exemplified in FIG. 5 on one of the body surfaces. Details of the specific shape and control of the electrodes along the joint connection of the base body plates are not described, since they are known per se from conventional holding apparatuses and can be selected depending on the specific task of the holding apparatus. Finally, the figures do not show scale illustrations of holding apparatuses, but in particular illustrate the provision of the electrode device along the joint between the base body plates of the base body.

Figure 5:
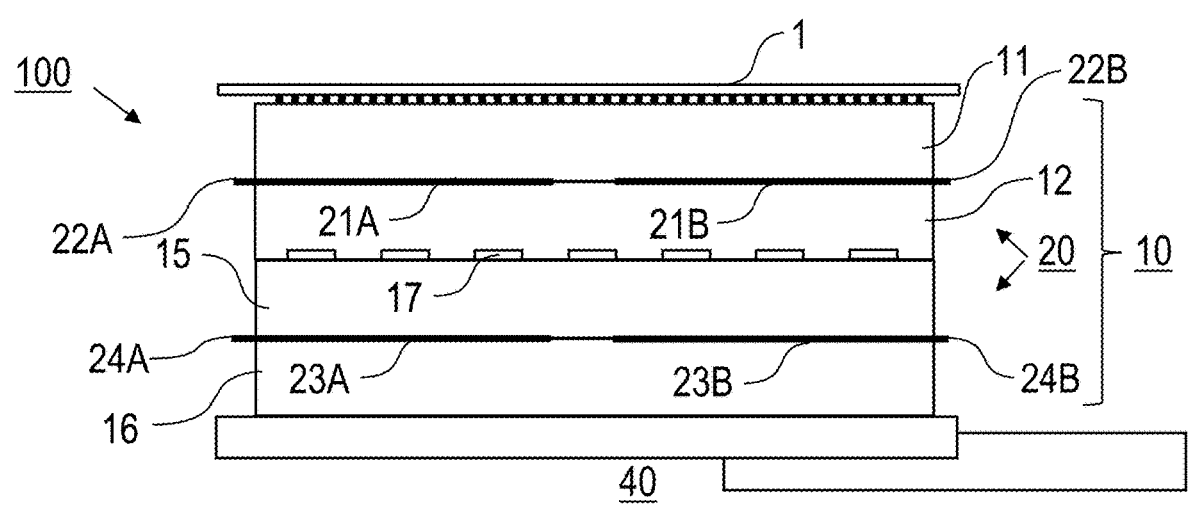
FIG. 5: a schematic illustration of another example of the holding apparatus according to embodiments of the invention.

The structure of the base body of the holding apparatus can be selected, as is known per se from conventional holding apparatuses (electrostatic clamps). The holding apparatus can e.g. be configured as a monopolar (FIG. 1 or 2) or as a bipolar holding apparatus (FIG. 3 or 5). Details of the temperature control of the holding apparatus and the application of electrical voltages for generating electrostatic holding forces are not described, since these are known per se from conventional holding apparatuses. The holding apparatus can be provided with further components, as is known per se from conventional electrostatic clamps.

FIG. 1 shows a first embodiment of the holding apparatus 100 (monopolar clamp) in a sectional view perpendicular to the thickness direction (FIG. 1A) and in a sectional view perpendicular to the lateral extension of the holding apparatus 100 (FIG. 1B). The holding apparatus 100 comprises a base body 10 with a pair of base body plates 11, 12, e. g. made of silicon nitride. An electrode device 20 with a single electrode is arranged between the base body plates 11, 12. In this embodiment, the electrode device 20 consists of a single, circular-shaped electrode layer 21 with a contact section 22, which extend parallel to the extension of the base body plates along a diffusion bond connection 13. The base body plates 11, 12 are connected to one another in a planar manner by means of the diffusion bond connection 13. The holding apparatus 100 is manufactured as described below with reference to the embodiment of FIG. 3.

Figure 4:
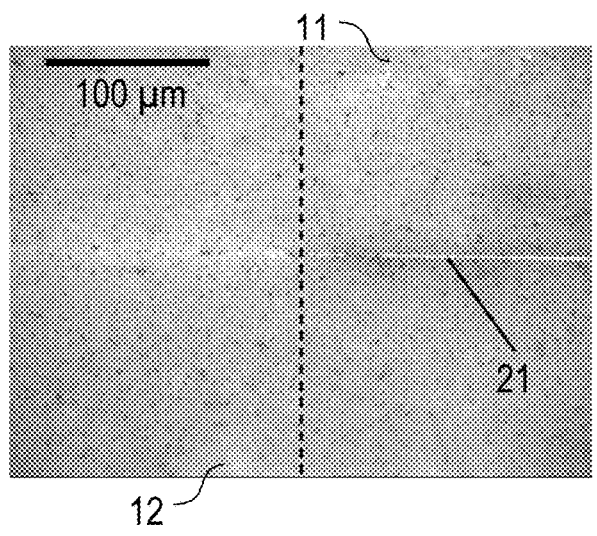
FIG. 4: a photographic sectional view of a base body of an electrostatic holding apparatus according to an embodiment of the invention.

In a practical application, the upper base body plate 11 has e. g. has thickness of 4 mm and the lower base body plate 12 has a thickness of 4 mm. The diameter of the circular base body plates 11, 12 is generally selected in a range from 150 mm to 400 mm and is e. g. 330 mm or 400 mm in the embodiments shown. The electrode layer 21 with the contact section 22 consists e. g. of titanium, and it has a thickness of e. g. 500 nm. The diameter of the electrode layer 21 (e. g. 300 mm) is smaller than the diameter of the base body plates 11, 12, so that an annular insulating region 14 is formed at the edge thereof. FIG. 4 shows a photographic sectional view of an example of a base body with the upper and lower base body plates 11, 12 and the electrode layer 21 therebetween.

The contact section 22 extends as a conductor path as an interruption of the insulating region 14 from the electrode layer 21 to the edge of the base body plates 11, 12. The contact section 22 is shown in FIG. 1 protruding beyond the edge of the base body plates 11, 12 in order to clarify that the contact section 22 is arranged on the edge for the connection of a connecting line. In practice, the protrusion is not absolutely necessary, but any other form of exposure for contacting is possible. In particular, it is alternatively possible to use a section of the electrode layer 21 as the contact section 22A, which section of the electrode layer 21 is contacted through a hole 12A in the base body plate 12, e. g. with conductive silver or an electrically conductive adhesive and/or a wire connection.

With the application of the holding apparatus 100 for holding a component (not shown), one of the base body plates, such as e. g. the upper base body plate 11, is provided for receiving the component and the other of the base body plates, such as e. g. the lower base body plate 12, is firmly connected with a tool carrier (not shown). The electrode layer 21 is connected via the contact section 22 and a connecting line (not shown) to a switchable voltage source for applying a holding voltage to the electrode layer 21.

Figure 2:
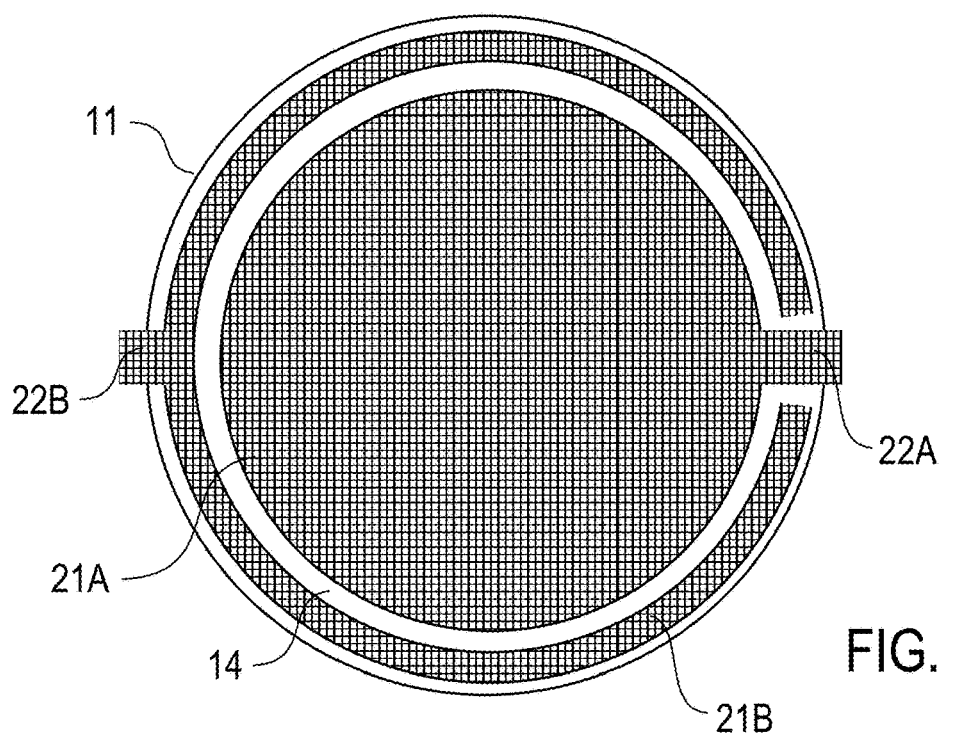
FIG. 2: a schematic illustration of an example of the holding apparatus according to embodiments of the invention.
Figure 3:
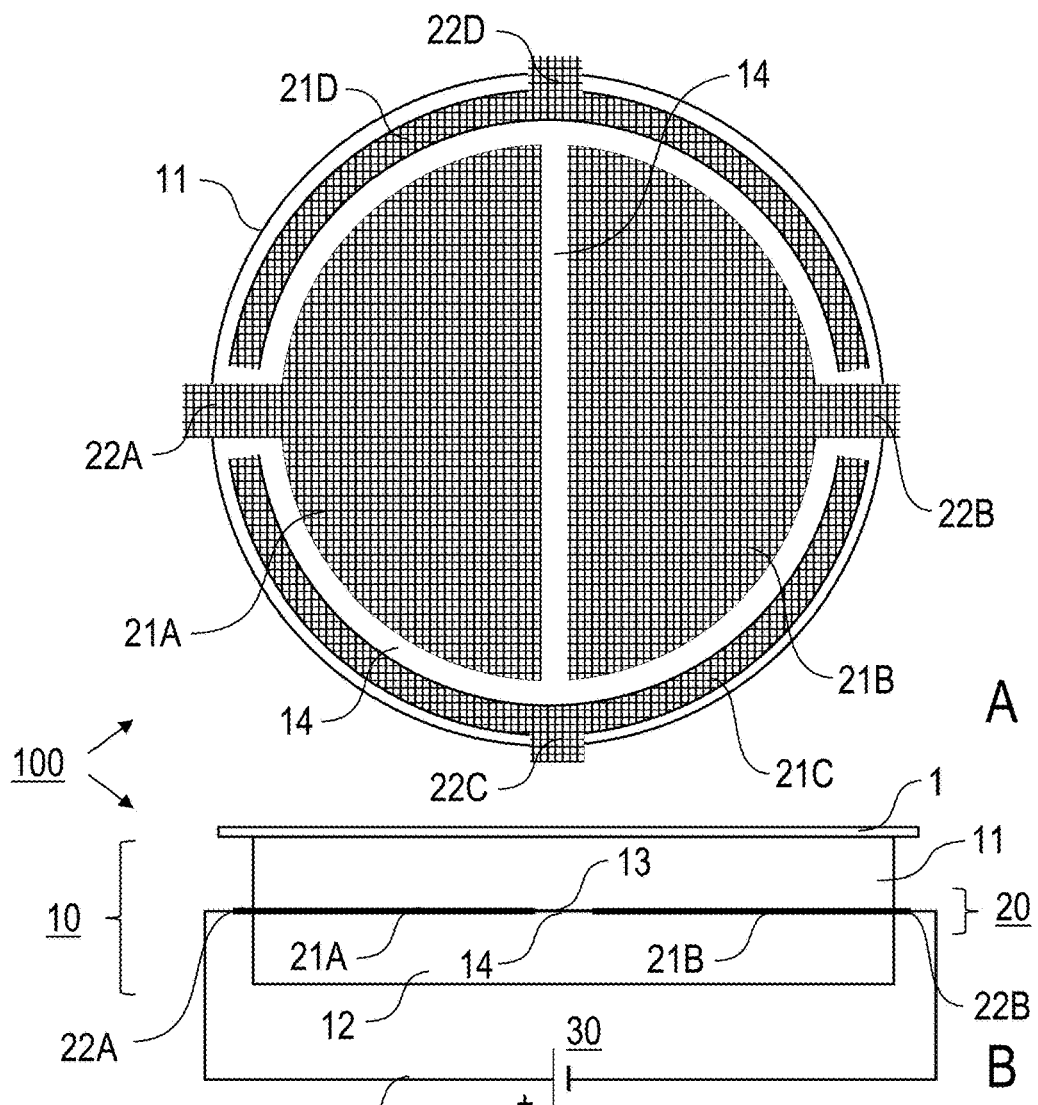
FIG. 3: a schematic illustration of an example of the holding apparatus according to embodiments of the invention.

FIG. 2 shows a modified variant of the embodiment of FIG. 1, wherein the holding apparatus 100 in the form of a monopolar clamp has a circular electrode layer 21A with a contact section 22A and additionally an annular electrode layer 21B with a contact section 22B. FIG. 2, like FIG. 1B, is a sectional view of the base body perpendicular to the lateral extension of the holding apparatus 100 and along the diffusion bond connection between the base body plates, so that only one of the base body plates 11 is shown. The annular electrode layer 21B is arranged for connection to ground potential and is used for field shielding. It forms a ring electrode surrounding the circular electrode layer 21A except for an interruption where the contact portion 22A of the circular electrode layer 21A extends toward the outer edge of the base body plates. The annular electrode layer 21A and the circular-shaped electrode layer 21B are electrically insulated from one another by the insulating region 14. Moreover, the holding apparatus 100 of FIG. 2 can be constructed as explained above and described with reference to the other figures.

The base body plates of the holding apparatus 100 according to FIG. 2 are connected to one another in a planar manner by means of a diffusion bond connection. The diffusion bond connection exists between the electrode layers 21A, 21B with the contact sections 22A, 22B and the adjacent base body plate and in the insulating regions 14 directly between the base body plates. The holding apparatus 100 is manufactured as described below with reference to the embodiment of FIG. 3.

FIG. 3 shows a further embodiment of the invention, wherein the holding apparatus 100 in the form of a bipolar clamp has two semi-circular electrode layers 21A, 21B each with a contact section 22A, 22B and additionally two semi-ring-shaped electrode layers 21C, 21D each with a contact section 22C, 22D. FIG. 3A is a sectional view of the base body 10 perpendicular to the lateral extension of the holding apparatus 100, while FIG. 3B shows a sectional view of the base body 10 perpendicular to its thickness direction and along the diffusion bond connection between the base body plates 11, 12. FIG. 3B additionally shows a semiconductor wafer 1 carried by the holding apparatus 100. In modified variants of a bipolar clamp, instead of the two semicircular electrode layers 21A, 21B, more than two electrode layers, e. g. each in the form of a segment of a circle, each with a contact section can be provided and/or the outer annular electrode layers can be omitted.

According to FIG. 3, each of the semicircular electrode layers 21A, 21B is connected via one of the contact sections 22A, 22B to a switchable voltage source 30. In the example shown, the volt-age source 30 is a DC voltage source with which a positive and a negative potential of a DC voltage can be applied to the semicircular electrode layers 21A, 21B for the electrostatic fixing of the semiconductor wafer 1. The semi-annular electrode layers 21C, 21D are arranged for field shielding for connection to ground potential. They surround the semicircular electrode layers 21A, 21B with the exception of the interruptions for the implementation of the contact sections 22A, 22B towards the outer edge of the base body plates 11, 12. Moreover, the holding apparatus 100 of FIG. 3 can be constructed as explained above and as described with reference to the other figures.

The holding apparatus 100 is manufactured as follows. Firstly, two plane ceramic plates are produced, each with a polished surface, which is intended for the formation of the diffusion bond connection. The other surface in each case can also be provided with a polished surface or with a structuring for the formation of burls or tempering medium conduits (see FIG. 5). The ceramic plates are produced using a method known per se, such as e. g. hot pressing, or a previously conducted shaping, such as cold isostatic or uniaxial pressing, followed by sintering, gas pressure sintering, and optionally followed by hot isostatic post-compression, or the deposition of the ceramic material from the gas phase (CVD, chemical vapor deposition). With glass-ceramic materials, also melting, nucleation and crystallization can be used for.

This is followed by a structured deposition of a layer of conductive material on one of the polished surfaces with the desired shape of the electrode layers. The deposition steps are preferably carried out using a lithographic method known per se. For example, in a first sub-step, the polished surfaces of one of the ceramic plate are masked with the desired shape of the electrode layers, and in a second sub-step, the ceramic plate is coated with a metal layer, e.g. by vacuum deposition. After developing the mask in a further sub-step, the structured layer of conductive material, e.g. with the shape of the electrode layers and contact sections according to FIG. 3 is obtained. As an alternative to the lithographic structuring described, the layer of conductive material can first be applied in a planar manner to one of the base body plates, followed by coating with a photoresist. The photoresist is light-exposed and developed with the desired shape of the electrode layers. The subsequent etching results in the desired structuring of the layer of conductive material in the lateral direction.

If an insulating intermediate layer is to be formed as a diffusion-supporting and/or planarizing layer in the lateral direction between the electrode layers, the steps of masking, deposition and development are repeated with the material of the insulating intermediate layer.

The diffusion bond is then produced by placing the ceramic plates with the mutually facing, touching polished surfaces, one of which bearing the structured layer of conductive material, in an uniaxial hot press and subjecting them to a predetermined pressing pressure at a predetermined temperature. Alternatively, a so-called Spark plasma-assisted hot press can be used, which advantageously allows very rapid heating. The temperature and the pressing pressure are selected taking into account the materials used, as is known per se from diffusion bonding. The temperature and the pressing pressure are preferably selected in the above-mentioned ranges. The pressing time of the hot pressing typically comprises a heating phase, a holding time and a cooling phase, and it is e. g. 0.5 h to 30 h, preferably 8 h to 12 h.

During hot pressing, atoms of the layer of conductive material or, in the insulating regions, atoms of one of the base body plates diffuse into the adjacent base body plate. If insulating intermediate layers are formed in the insulating regions, their atoms diffuse into the adjacent base body plate. The atoms of the adjacent joining partners create a diffusion profile, so that the joining partners are firmly bonded to one another. With the above examples, a diffusion profile of titanium atoms is generated in the neighbouring ceramic of the adjacent base body plate.

Finally, the composite of the base body plates is subjected to post-processing, comprising thinning one of the base body plates, which is provided as the carrier of the component to be held, and contacting the two electrode layers via the contact sections. The thinning of one of the base body plates serves to form a dielectric layer by the base body plate. The electrostatic clamping pressure of the holding apparatus depends in particular on the voltage, on the distance of the electrodes from the burl support plane and on the dielectric properties of the material composition at this distance. The holding force of the holding apparatus is thus set with the thickness of the dielectric layer. The thinning takes place with a removal method known per se, such as e. g. grinding, lapping and polishing. As a result, the holding apparatus is obtained as a component with integrated conductive layers which are separated by electrically insulating regions and contacted.

Optionally, in a modification of the described method, after the formation of the layer of conductive material structured in the lateral direction and before the formation of the diffusion bond connection, the conductive material can be embedded in the supporting base body plate by thermal diffusion. The base body plate with the structured layer of conductive material is heated to a temperature below the melting temperature of the conductive material, e.g. in a range of 500° C. to 1400° C., preferably to 1000° C. Atoms of the conductive material are implanted in the associated base body plate, so that the deposited conductive material is at least partially embedded in the base body plate. Then residues of the deposited conductive material that protrude beyond the surface of the base body plate can be removed.

In a specific example, the holding apparatus is produced using the method described as follows. Two silicon nitride disks with a size of 0=100 mm×5.1 mm are lapped to a global flatness of 10 µm. The surfaces are then polished using a diamond suspension, grain size typically 1 µm to 3 µm to a flatness of a few to less than 1 µm and a roughness (RMS) of less than 15 nm. The parts are then cleaned. Two crescent-shaped layers of titanium (thickness 500 nm) are coated using a mask (adhesive film) (see FIG. 3). The two parts are then diffusion bonded in the hot press with the following parameters: heating rate: 10 K/min, temperature: 1350° C., pressing pressure: 400 bar, holding time 3 h, atmosphere: nitrogen. After hot pressing, one of the disks is thinned to a thickness of 0.3 mm and the electrodes are contacted.

The electrostatic effect of the holding apparatus produced in this way was tested by placing a test component on the holding apparatus and measuring it interferometrically. The test component comprises a 2-inch silicon wafer with a burl structure. The burls have a diameter of 500 µm and a height of 10 µm. The distance is 7 mm. The initial thickness of the wafer is 275 µm. While the voltage at the electrodes was gradually increased to 2000 V, the curvature of the silicon wafer was measured interferometrically as a measure of the clamping pressure. The clamping pressure increases with the voltage and reaches about 80 mbar in the tested example.

FIG. 5 shows an embodiment of the holding apparatus 100 according to the invention with a base body 10 composed of two pairs of base body plates 11, 12 and 15, 16.

Each of the first and the second pair of base body plates 11, 12 and 15, 16 is joined by a diffusion bonded connection and assembled, as described above with reference to FIGS. 1 to 3. Electrode layers 21A, 21B and 23A, 23B with contact sections 22A, 22B and 24A, 24B are respectively arranged between the base body plates 11, 12 and 15, 16 along the lateral extension of the diffusion bond connections. The contact sections 22A, 22B and 24A, 24B are each connected to a separately switchable volt-age source (not shown).

The first pair of base body plates 11, 12 is provided for receiving the component 1 to be held under the effect of the electrostatic holding force which is generated with the electrode layers 21A, 21B. With the second pair of base body plates 15, 16, the holding apparatus 100 is fixed to a schematically shown tool carrier 40 under the effect of the electrostatic holding force that is generated with the electrode layers 24A, 24B. In one of the base body plates (e. g. 12), temperature control conduits 17 are provided for receiving a temperature control medium, preferably for cooling the holding apparatus 100.

While the invention has been described in detail and with reference to specific examples thereof, it will be apparent to one skilled in the art that various changes and modifications can be made therein without departing from the spirit and scope thereof. The features of the invention disclosed in the above description, the drawings and the claims can be of importance both individually and in combination or subcombination for the implementation of the invention in its various configurations.

What is claimed is:

1. Holding apparatus, which is adapted for electrostatically holding a component, comprising:
    an electrically insulating base body, which comprises a first pair of base body plates, which are connected to each other in a planar manner via a joint connection, and
    an electrode device with at least one electrode layer, which is arranged to generate an electrostatic holding force and extends parallel to an extension of the base body plates along the joint connection, wherein
    the joint connection comprises a diffusion bond connection, wherein the at least one electrode layer is connected in a planar manner to a respectively adjacent base body plate,
    the at least one electrode layer has a contact section, which is arranged for electrically contacting of the at least one electrode layer,
    the electrode device comprises at least two electrode layers, which extend parallel to the extension of the base body plates along the diffusion bond connection and which are arranged separated from each other by at least one insulating region, and
    the base body plates are connected in the at least one insulating region via the diffusion bond connection directly or via an insulating intermediate layer.

2. Holding apparatus according to claim 1, wherein the base body plates each comprise a ceramic material.

3. Holding apparatus according to claim 2, wherein the base body plates each comprise at least one of silicon nitride, silicon carbide, silicon aluminum oxide nitride, aluminum oxide, titanium oxide, zirconium oxide, yttrium oxide, oxynitride glass, aluminum nitride, sapphire, aluminate, yttrium aluminia garnet, silicate, aluminosilicate, cordierite, and glass ceramic, or a composite thereof.

4. Holding apparatus according to claim 1, wherein
the electrode layers each comprise a metal, a metal alloy, a semiconductor material or an electrically conductive ceramic.

5. Holding apparatus according to claim 4, wherein
the electrode layers comprise at least one of chromium, aluminum, titanium, tungsten, molybdenum, silicon, manganese, vanadium, cobalt, nickel, gold, silver, an AgCuTi alloy, a molybdenum-manganese alloy, a tin-gold alloy, a eutectic gold-silicon alloy, metal nitride, titanium nitride, chromium nitride, a metal silicide, molybdenum silicide, and a carbide, such as silicon carbide doped with nitrogen.

6. Holding apparatus according to claim 1, wherein
the at least one electrode layer is arranged between the base body plates, with atoms of the at least one electrode layer being arranged diffused into the two adjacent base body plates.

7. Holding apparatus according to claim 1, wherein
the at least one electrode layer is embedded in one of the base body plates, with atoms of the at least one electrode layer being arranged diffused into the respective adjacent base body plate with which the diffusion bond connection is made.

8. Holding apparatus according to claim 7, wherein
all electrode layers are embedded in one of the base body plates and atoms of the electrode layers are arranged diffused into the other of the base body plates.

9. Holding apparatus according to claim 1, wherein
the base body further comprises a second pair of base body plates, between which at least one further electrode layer of the electrode device is arranged and which have a joint connection like the first pair of base body plates, wherein
the at least one further electrode layer has a contact section which is arranged for electrically contacting the at least one further electrode layer, and
the first pair of base body plates and the second pair of base body plates are connected to one another in a planar manner via a diffusion bond connection and form a plate stack.

10. Holding apparatus according to claim 9, wherein
in at least one of the interconnected base body plates of the first pair and the second pair of base body plates temperature control conduits are provided.

11. Holding apparatus according to claim 1, wherein
the holding apparatus is adapted for electrostatically holding a semiconductor wafer.

12. A method for manufacturing a holding apparatus, which is adapted for electrostatically holding a component, comprising:
providing two base body plates,
providing at least one electrode layer on at least one of the base body plates, the at least one electrode layer having a contact section,
pressing the base body plates with a mutual arrangement, in which the at least one electrode layer with the contact section is positioned between the base body plates, wherein a joint connection is formed, which comprises a diffusion bond connection through which the at least one electrode layer and the contact section are connected in a planar manner to the adjacent base body plate,
at least two electrode layers are provided on at least one of the base body plates, the at least two electrode layers being arranged separated from each other by at least one insulating region, and
the base body plates are connected in the at least one insulating region via the diffusion bond connection directly or via an insulating intermediate layer.

13. Method according to claim 12, wherein the providing of the at least two electrode layers on the at least one of the base body plates comprises:
generating at least one planar precursor layer on the at least one of the base body plates, and
structuring the at least one planar precursor layer to form the at least two electrode layers and the insulating regions.

14. Method according to claim 13, further comprising:
embedding the at least one electrode layer into the at least one of the base body plates by thermal diffusion, and
removing protruding areas of the at least one electrode layer.

15. Method according to claim 12, further comprising:
contacting the at least one electrode layer by connecting the associated contact section to a connecting line.

16. Holding apparatus, which is adapted for electrostatically holding a component, comprising:
an electrically insulating base body, which comprises a first pair of base body plates, which are connected to each other in a planar manner via a joint connection, and
an electrode device with at least one electrode layer, which is arranged to generate an electrostatic holding force and extends parallel to an extension of the base body plates along the joint connection, wherein
the joint connection comprises a diffusion bond connection, wherein the at least one electrode layer is connected in a planar manner to a respectively adjacent base body plate,
the at least one electrode layer has a contact section, which is arranged for electrically contacting of the at least one electrode layer, and
the electrode layers each comprise a metal, a metal alloy, a semiconductor material or an electrically conductive ceramic.

17. Holding apparatus according to claim 16, wherein
the base body plates each comprise a ceramic material.

18. Holding apparatus according to claim 16, wherein
the at least one electrode layer is arranged between the base body plates, with atoms of the at least one electrode layer being arranged diffused into the two adjacent base body plates.

19. Holding apparatus according to claim 16, wherein
the at least one electrode layer is embedded in one of the base body plates, with atoms of the at least one electrode layer being arranged diffused into the respective adjacent base body plate with which the diffusion bond connection is made.

20. Holding apparatus according to claim 16, wherein
the holding apparatus is adapted for electrostatically holding a semiconductor wafer.

* * * * *